(12) United States Patent
Liu et al.

(10) Patent No.: US 8,369,175 B1
(45) Date of Patent: Feb. 5, 2013

(54) MEMORY ELEMENTS WITH VOLTAGE OVERSTRESS PROTECTION

(75) Inventors: Lin-Shih Liu, Fremont, CA (US); Andy L. Lee, San Jose, CA (US); Ping-Chen Liu, Fremont, CA (US); Irfan Rahim, Milpitas, CA (US); Srinivas Perisetty, Hyderabad (IN)

(73) Assignee: Altera Corporation, San Jose, CA (US)

( * ) Notice: Subject to any disclaimer, the term of this patent is extended or adjusted under 35 U.S.C. 154(b) by 225 days.

(21) Appl. No.: 12/874,152

(22) Filed: Sep. 1, 2010

(51) Int. Cl.
*G11C 5/14* (2006.01)

(52) U.S. Cl. ............ 365/226; 365/49.1; 365/49.11; 365/154; 365/156; 365/189.011; 365/189.15; 365/189.17; 365/189.05; 365/202; 365/205

(58) Field of Classification Search ........... 365/49.1, 365/49.11, 154, 156, 189.011, 189.15, 189.17, 365/189.05, 202, 205, 226
See application file for complete search history.

(56) References Cited

U.S. PATENT DOCUMENTS

| | | | | |
|---|---|---|---|---|
| 6,363,011 B1 * | 3/2002 | Hirose et al. | ............. | 365/185.07 |
| 6,724,657 B2 * | 4/2004 | Shukuri | ............. | 365/185.07 |
| 6,972,987 B1 * | 12/2005 | Wong et al. | ............. | 365/154 |

OTHER PUBLICATIONS

Xu et al., U.S. Appl. No. 12/571,143, filed Sep. 30, 2009.
White, U.S. Appl. No. 12/753,809, filed Apr. 2, 2010.
Rahim et al., U.S. Appl. No. 12/345,560, filed Dec. 29, 2008.
Liu et al., U.S. Appl. No. 12/629,831, filed Dec. 2, 2009.

* cited by examiner

*Primary Examiner* — Fernando Hidalgo
(74) *Attorney, Agent, or Firm* — Treyz Law Group; Jason Tsai

(57) ABSTRACT

Integrated circuits may include memory elements that are provided with voltage overstress protection. One suitable arrangement of a memory cell may include a latch with two cross-coupled inverters. Each of the two cross-coupled inverters may be coupled between first and second power supply lines and may include a transistor with a gate that is connected to a separate power supply line. Another suitable memory cell arrangement may include three cross-coupled circuits. Two of the three circuits may be powered by a first positive power supply line, while the remaining circuit may be powered by a second positive power supply line. These memory cells may be used to provide an elevated positive static control signal and a lowered ground static control signal to a corresponding pass gate. These memory cells may include access transistors and read buffer circuits that are used during read/write operations.

24 Claims, 10 Drawing Sheets

MEMORY ELEMENTS WITH VOLTAGE OVERSTRESS PROTECTION

BACKGROUND

This relates to memory elements, and more particularly, to memory elements such as volatile memory elements with voltage overstress protection features.

Integrated circuits often contain volatile memory elements. Typical volatile memory elements are based on cross-coupled inverters (latches). Volatile memory elements retain data as long as the integrated circuit is powered. For example, integrated circuits may include volatile memory elements such as static random access memory (SRAM) cells.

Integrated circuits such as programmable integrated circuits may include volatile memory elements such as configuration random access memory (CRAM) cells that are loaded with configuration data. Each CRAM cell has an output that provides a control signal that is used to enable or disable pass transistors in logic circuitry. Pass transistors (pass gates) are typically formed from n-channel transistors.

Pass transistors are turned on or off to selectively pass or block passage of logic signals in response to the control signal provided by the CRAM cells. In an effort to increase performance, pass transistors can be turned on using elevated gate control signals. In an effort to reduce leakage, pass transistors can be turned off using lowered gate control signals.

CRAM cells can be powered using an elevated positive power supply voltage level (i.e., a voltage level that is greater than a nominal positive power supply voltage level that is supplied to other parts of the integrated circuit) and a lowered ground power supply voltage level (i.e., a voltage level that is less than a nominal ground power supply voltage level that is supplied to other parts of the integrated circuit). This type of CRAM cell can be used to produce the elevated control signals and the lowered control signals. However, biasing memory cells in this way may overstress the transistors in the memory cells, leading to a potential for transistor breakdown and unacceptable reliability.

Conventional methods for counteracting this type of voltage overstress include forming memory cells with thick oxide transistors. The fabrication of thick oxide memory transistors may be undesirable, however, because such transistors may require the use of additional and potentially incompatible processing steps.

It would therefore be desirable to be able to provide improved memory elements with voltage overstress protection features.

SUMMARY

Integrated circuits may include memory elements that are provided with voltage overstress protection. A memory cell with voltage overstress protection may have a storage portion that includes first and second cross-coupled circuits. Each of the two circuits may be coupled between a first power supply line (e.g., a power supply line on which an elevated positive power supply voltage is conveyed) and a second power supply line (e.g., a power supply line on which a lowered ground power supply voltage is conveyed).

The two circuits may each include first and second n-channel transistors connected in series. The first re-channel transistor of the first circuit may have a gate that is connected to a third power supply line that is different from the first power supply line and a source terminal that is connected to a gate of the second n-channel transistor of the second circuit. Similarly, the first n-channel transistor of the second circuit may have a gate that is connected to the third power supply line and a source terminal that is connected to a gate of the second n-channel transistor of the first circuit. The third power supply line may be driven to a positive power supply voltage that is lower than the elevated positive power supply voltage. The second power supply line may be lowered to further reduce voltage stress in the memory cell.

Access transistors may be connected to the storage portion of the memory cell. For example, a first access transistor may be coupled between a first data line and the gate of the second n-channel transistor in the first circuit, whereas a second access transistor may be coupled between a second data line and the gate of the second re-channel transistor in the second circuit. The access transistors may each have a gate that is controlled by an address signal. The data lines and the address signal may be controlled to read data from and write data into the memory cell.

If desired, the memory cell may have a storage portion that includes first, second, and third circuits. The first circuit may be coupled between a first power supply line (e.g., a power supply line on which an elevated positive power supply voltage is conveyed) and a second power supply line (e.g., a power supply line on which a lowered ground power supply voltage is conveyed). The second circuit may be supplied by a third power supply line (e.g., a power supply line that is driven to a positive power supply voltage that is lower than the elevated positive power supply voltage). The third circuit may be coupled between the first power supply line and a ground power supply line (e.g., a power supply line that is driven to zero volts). The third power supply line may be lowered to further reduce voltage stress in the memory cell.

The first circuit may have n-channel transistors with gates that are connected to an output of the second circuit. The n-channel transistors of the first circuit may be stacked in series to reduce leakage currents flowing through the first circuit.

Access transistors may be connected to the storage portion of the memory cell. For example, a first access transistor may be coupled between a first data line and an output of the third circuit, whereas a second access transistor may be coupled between a second data line and an output of the first circuit. The access transistors may each have a gate that is controlled by an address signal.

A read buffer circuit may be coupled between the first data line and the ground line. The read buffer circuit may include first and second n-channel transistors connected in series. The first n-channel transistor of the read buffer circuit may have a gate that is connected to the output of the first circuit, whereas the second n-channel transistor of the read buffer circuit may have a gate that is controlled by a read control signal. The data lines, access transistors, and read buffer circuit may be controlled to write data into and read data from the memory cell.

These memory cells may be used in integrated circuits such as programmable integrated circuits to provide elevated control signals and lowered control signals (depending on the state of the bits loaded into the cells). The elevated control signals and lowered control signals may serve as static control signals that are provided to gates of pass transistors to improve pass gate performance and to reduce leakage currents.

Further features of the present invention, its nature and various advantages will be more apparent from the accompanying drawings and the following detailed description.

DETAILED DESCRIPTION

This relates to integrated circuits with memory elements. Memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit.

On integrated circuits such as memory chips or other circuits in which memory is needed to store processing data, the memory elements can be used to perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
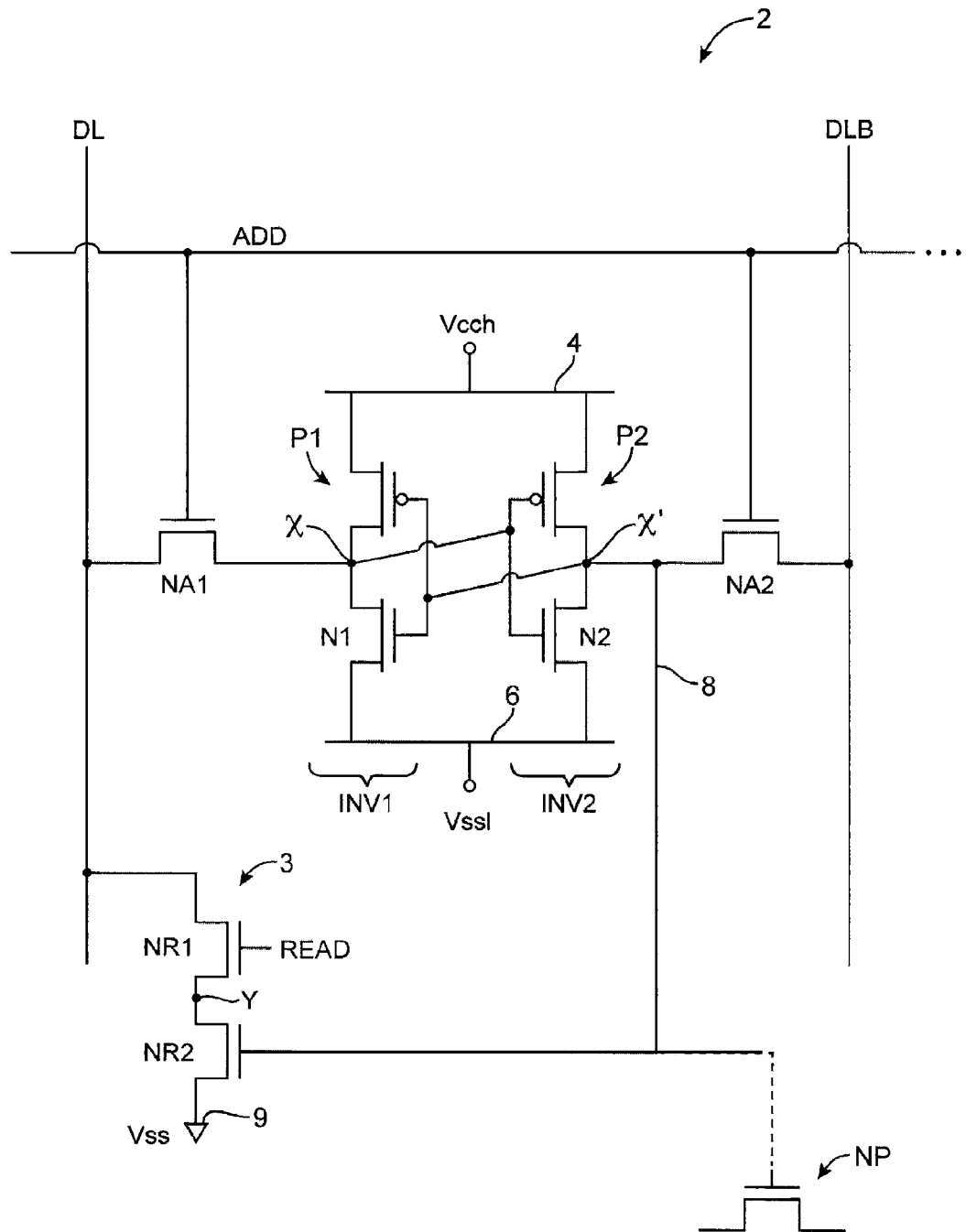
FIG. 1 is a circuit diagram of a conventional eight transistor configuration random access memory cell.

FIG. 1 shows one type of conventional CRAM cell. As shown in FIG. 1, conventional CRAM cell 2 is an 8-transistor memory cell that includes a pair of cross-coupled inverters (i.e., a latch), two access transistors, and read buffer circuit 3. The latch includes inverters INV1 and INV2. Inverter INV1 has an output that is connected to an input of inverter INV2, whereas inverter INV2 has an output that is connected to an input of inverter INV1. Inverters INV1 and INV2 are cross-coupled and form a storage portion for CRAM cell 2.

The storage portion of CRAM cell 2 is powered by positive power supply line 4 (i.e., a power supply line supplied with an elevated positive power supply voltage) and ground power supply line 6 (i.e., a power supply line supplied with a lowered ground power supply voltage). Inverter INV1 includes p-channel transistor P1 and n-channel transistor N1. Transistor P1 has a source terminal that is connected to positive power supply line 4, a drain terminal that is connected to the output of INV1, and a gate that is connected to the input of INV1. Transistor N1 has a drain terminal that is connected to the output of INV1, a source terminal that is connected to ground power supply line 6, and a gate that is connected to the input of INV1.

Similarly, inverter INV2 includes p-channel transistor P2 and n-channel transistor N2. Transistor P2 has a source terminal that is connected to positive power supply line 4, a drain terminal that is connected to the output of INV2, and a gate that is connected to the input of INV2. Transistor N2 has a drain terminal that is connected to the output of INV2, a source terminal that is connected to ground power supply line 6, and a gate that is connected to the input of INV2.

The output of inverter INV1 is connected to first data storage node X, whereas the output of inverter INV2 is connected to second data storage node X' (see, e.g., FIG. 1). First n-channel access transistor NA1 is connected between data storage node X and a first data line (i.e., a data line on which true data signal DL is conveyed), whereas second n-channel access transistor NA2 is connected between data storage node X' and a second data line (i.e., a data line on which complementary data signal DLB is conveyed). Access transistors NA1 and NA2 have gates that are connected to an address line on which address signal ADD is conveyed. Access transistors such as transistors NA1 and NA1 may therefore sometimes be referred to as address transistors.

During write operations, desired data signals are presented on the first and second data lines. Address signal ADD is asserted to enable access transistors NA1 and NA2 to write in a desired value into CRAM cell 2.

Read circuit 3 includes n-channel read transistors NR1 and NR2 connected in series. Transistor NR1 has a drain terminal that is connected to the first data line, a source terminal that is connected to intermediate node Y, and a gate that is controlled by read signal READ. Transistor NR2 has a drain terminal that is connected to intermediate node Y, a source terminal that is connected to a ground power supply line 9 (i.e., a ground line that is driven to zero volts), and a gate that is connected to data storage node X'.

During read operations, the first and second data lines are precharged to a high voltage level. Read control signal READ is asserted to enable read circuit 3 to read data from CRAM cell 2 while address signal ADD is deasserted. If cell 2 is storing a logic "1" (i.e., node X' is storing a "1"), data line DL will discharge towards zero volts through transistors NR1 and NR2. If cell 2 is storing a "0" (i.e., if node X' is storing a "0"), the first data line will remain charged at the high voltage level.

CRAM cell 2 has an output 8 that is connected to data storage node X' and that provides a static control signal to the gate of pass transistor (pass gate) NP. Pass transistors NP are typically n-channel transistors that serve as building blocks for programmable logic. Pass transistors NP can be selectively placed in an on state or an off state to pass or block passage of logic signals between their source-drain terminals in the programmable logic depending on the value of the static control signal.

CRAM cell 2 is supplied with elevated positive power supply voltage Vcch over positive power supply line 4 and with lowered ground power supply voltage Vssl over ground supply line 6 to improve pass gate performance in the on state and to reduce pass gate leakage in the off state, respectively.

For example, consider a scenario in which an integrated circuit includes logic circuitry and other digital/analog circuitry supplied with a nominal positive power supply voltage Vcc having a value of 0.85 V and nominal ground power supply voltage Vss having a value of zero volts. CRAM cell 2 is supplied with elevated positive power supply voltage Vcch having a value of 1.2 V and lowered ground supply voltage Vssl having a value of −0.1 V. Powering the storage portion of CRAM 2 using voltages Vcch and Vssl that are different from the nominal voltage levels (i.e., voltage Vcch is greater than Vcc, whereas voltage Vssl is less than Vss) can enhance pass gate performance.

In particular, overdriving pass gates NP with elevated voltage Vcch improves the drive strength (e.g., speed) of pass gates NP that in the on state. In contrast, driving pass gates NP with lowered voltage Vssl when off reduces leakage currents.

Biasing CRAM cell 2 using voltages Vcch and Vssl may, however, overstress the n-channel transistors in CRAM cell 2. Consider a scenario in which CRAM cell 2 is biased using Vcch at 1.2 V and Vssl at −0.1 V and is loaded with a "0" (i.e., data storage node X' is storing a "0" while data storage node X is storing a "1"). The gate of n-channel transistor N2 is driven to Vcch through transistor P1, whereas the source of transistor N2 is tied to Vssl. Transistor N2 therefore experiences a gate-to-source voltage Vgs of 1.3 V (1.2 minus −0.1). A Vgs value of 1.3 V may undesirably overstress n-channel transistor N2 and result in reliability issues such as device breakdown and circuit malfunction. It may therefore be desirable to provide memory elements (cells) with voltage overstress protection.

Figure 2:
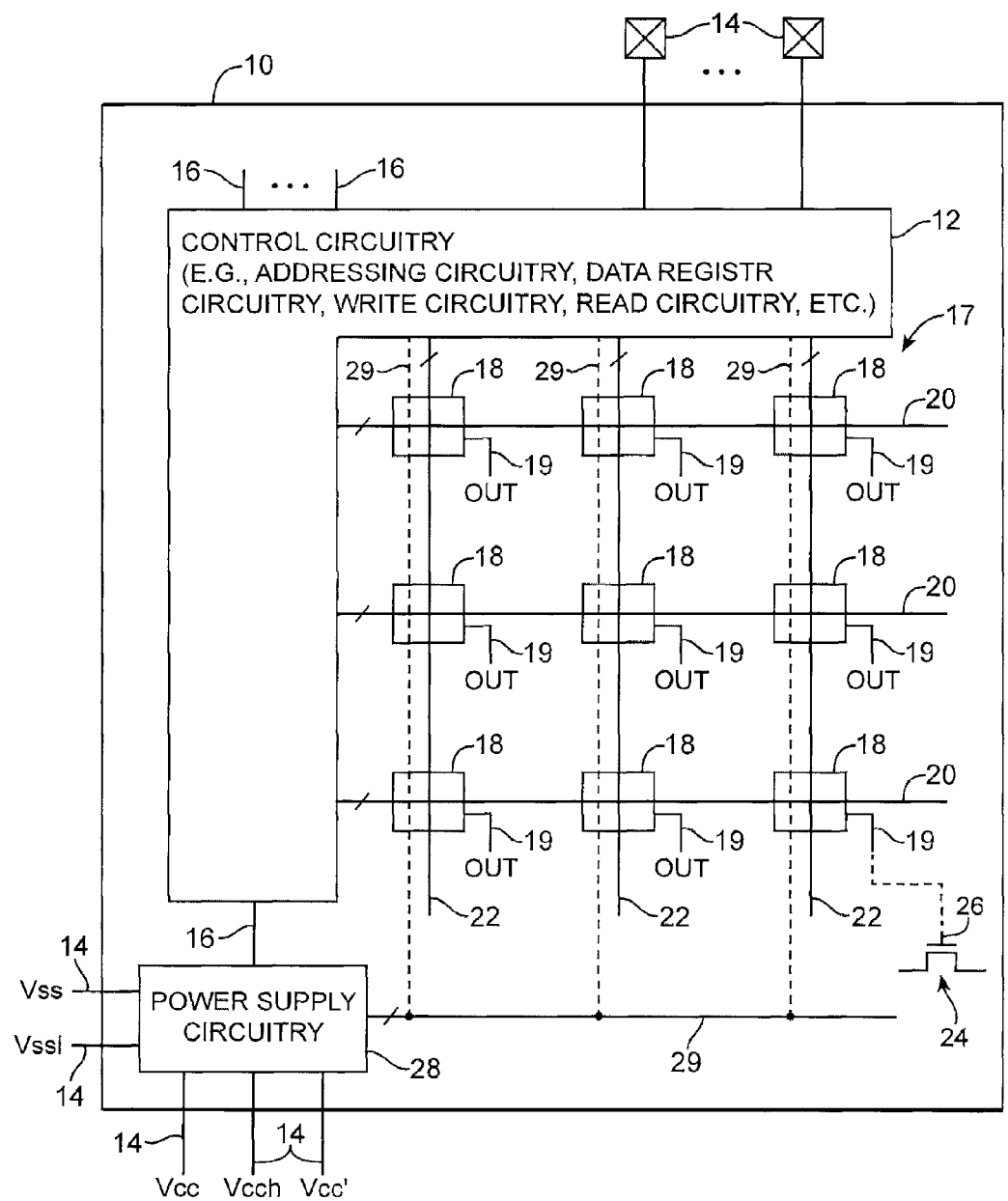
FIG. 2 is a diagram of an illustrative memory element array in accordance with an embodiment of the present invention.

FIG. 2 shows an integrated circuit that includes an array 17 of memory cells 18 with voltage overstress protection. One suitable arrangement is shown in FIG. 2. There are three rows and columns of memory cells 18 in the illustrative array of FIG. 2, but in general there may be hundreds or thousands of rows and columns in memory array 17. Array 17 may be one of a number of arrays on given device 10, may be a subarray that is part of a larger array, or may be any other suitable group of memory cells 18.

Each memory element may supply a corresponding output signal OUT on a corresponding output path 19. In CRAM arrays, each signal OUT is a static output control signal that may be used in configuring a corresponding transistor such as transistor 24 (e.g., output signal OUT may be used to control gate 26 of corresponding transistor 24) or other circuit element in an associated programmable logic circuit. Transistor 24 may sometimes be referred to as a pass transistor or a pass gate. The state of transistor 24 (off or on) controls whether signals are allowed to pass between its source-drain terminals.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, other circuitry for controlling read and write operations, etc. Control circuitry 12 may use the power supply voltages supplied by pins 14 and 16 or by power supply circuitry 28 to produce desired fixed signals and time-varying on paths such as paths 20 and 22.

There may, in general, be any suitable number of conductive lines associated with paths 20 and 22. For example, each row of array 17 may have an associated address line (sometimes referred to as a word line) and associated read/write enable lines in a respective one of paths 20 (as examples). Each column of array 17 may have a respective path 22 that includes associated data lines (e.g., a true data line and a complement data line). The data lines may sometimes be referred to as bit lines. Control lines such as address lines and data lines are typically orthogonal to each other (e.g., address lines are horizontal while data lines are vertical or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive.

Power supply circuitry 28 may receive positive power supply voltages Vcc, Vcch, and Vcc' and ground power supply voltages Vss and Vssl provided through pins 14, as shown in FIG. 2 and/or these signals may be generated internally. Power supply circuitry 28 may distribute power in parallel using a pattern of shared power lines 29 (e.g., voltages Vcc, Vcch, Vcc', Vss, and Vssl can be supplied to each memory cell 18 over power lines 29). Power supply voltages Vcc and Vss may be supplied to other circuitry (e.g., digital and analog circuitry) on integrated circuit 10. Power supply voltages Vcc and Vss may sometimes be referred to as a nominal positive supply voltage and a nominal ground supply voltage, respectively.

Any suitable values may be used for positive power supply voltages Vcc, Vcch, and Vcc' and ground voltage Vss and Vssl. In a typical arrangement, positive power supply voltage Vcc may be 0.85 V, Vcch may be 1.2 V, and Vcc' may be 1.0 V. Ground voltage Vss may be zero volts and voltage Vssl may be −0.1 V (as examples). If desired, the positive power supply voltages and the ground power supply voltages can have other suitable voltage values.

Figure 3:
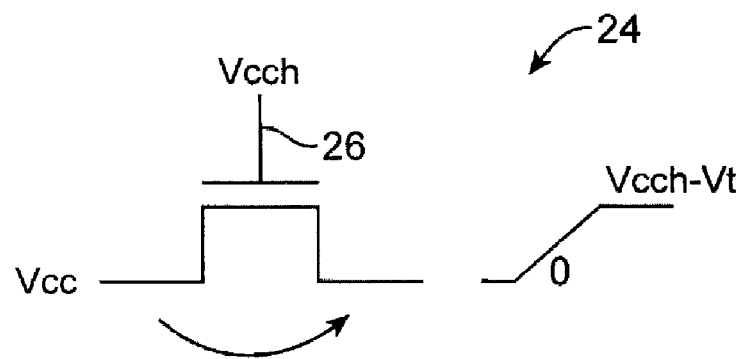
FIG. 3 is a diagram of an illustrative pass gate in an on state in accordance with an embodiment of the present invention.

FIG. 3 shows pass transistor 24 that may be placed in an on state to pass a high data signal. Pass gate 24 may be an n-channel transistor (as an example). Pass gate 24 may have a drain terminal (i.e., a first source-drain terminal) that is driven to nominal positive power supply voltage Vcc, a gate 26 that is driven to elevated positive power supply voltage Vcch, and a source terminal (i.e., a second source-drain terminal) that is initially at a low voltage (e.g., zero volts). Driving gate 26 of transistor 24 to elevated voltage Vcch may improve the speed of transistor 24 relative to driving gate 26 at Vcc.

Pass gate 24 may be turned on, because gate-to-source voltage Vgs is greater than threshold voltage Vt of transistor 24. The source terminal of gate 24 may be charged up to a voltage level that is one threshold voltage Vt below the voltage of gate 26 (e.g., the source terminal of gate 24 may be driven to a voltage level that is equal to Vcch minus Vt). Passing a high data signal using elevated positive power supply voltage Vcch rather than nominal positive power supply voltage Vcc improves the performance of pass transistor 24, because a higher Vgs value improves transistor drive strength.

Figure 4:
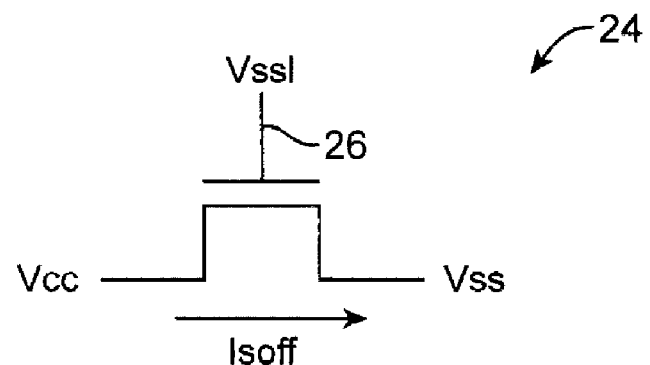
FIG. 4 is a diagram of an illustrative pass gate in an off state in accordance with an embodiment of the present invention.

FIG. 4 shows pass transistor 24 that may be placed in an off state to block passage of a data signal. For example, pass gate 24 may have a drain terminal that is driven to nominal positive power supply voltage Vcc, a gate 26 that is driven to lowered ground power supply voltage Vssl (i.e., a Vssl value less than Vss), and a source terminal that is at a low voltage (e.g., a Vss value of zero volts).

Gate 24 is in the off state, because gate-to-source voltage Vgs is less than threshold voltage Vt. Ideally, no current should flow through transistor 24 in the off state. In practice, undesirable leakage currents may flow through the different terminals of transistor 24. Source-to-drain leakage currents and bulk leakage currents (collectively referred to as leakage currents Isoff) can be reduced by lowering the gate voltage level relative to the drain voltage level. As a result, driving gate 26 of transistor 24 to lowered voltage Vssl rather than nominal ground voltage Vss reduces leakage currents Isoff through transistor 24.

Elevated positive power supply voltage Vcch and lowered ground power supply voltage Vssl may be provided as the static control signals that are supplied to transistor 24 from a given data storage node of memory cell 18. For example, memory cell 18 may be configured to store a logic "1" at the given data storage node (e.g., the given data storage node is driven to Vcch) to place corresponding pass gate 24 in the on state. Memory cell 18 may also be configured to store a logic "0" at the given data storage node (e.g., the given data storage node is driven to Vssl) to place corresponding pass gate 24 in the off state.

Figure 5:
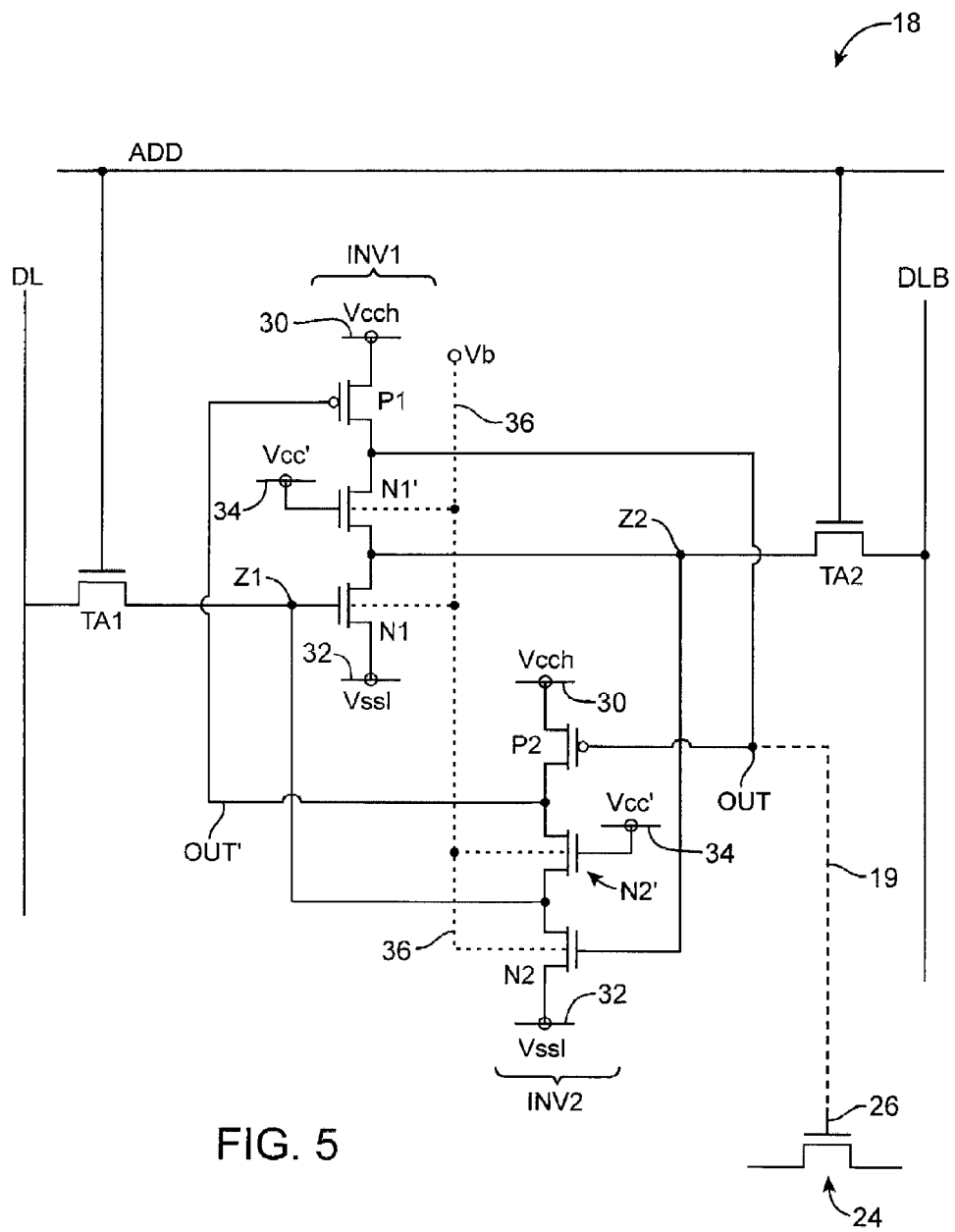
FIG. 5 is a circuit diagram of an illustrative memory cell with voltage overstress protection in accordance with an embodiment of the present invention.

FIG. 5 is a circuit diagram of an illustrative memory cell 18 with voltage overstress protection. Transistors in the storage portion of memory cell 18 are arranged so that the n-channel transistors do not experience voltage overstress. Voltage overstress protection may be provided by stacking an additional transistor with a gate that is driven to a separate power supply voltage in each of the cross-coupled inverters in the storage portion of cell 18.

As shown in FIG. 5, the storage portion of cell 18 may include cross-coupled inverter-like circuits such as circuits INV1 and INV2. Circuit INV1 may include p-channel transistor P1 and n-channel transistors N1 and N1' connected in series, whereas circuit INV2 may include p-channel transistor P2 and n-channel transistors N2 and N2' connected in series.

Transistors P1, N1, and N1' of inverter INV1 may be coupled between power supply lines 30 and 32. Transistor P1 may have a source terminal that is connected to power supply line 30 (e.g., a positive power supply line that is driven to Vcch), a gate that is connected to data storage node OUT', and a drain terminal that is connected to data storage node OUT. Transistor N1' may have a drain terminal that is connected to data storage node OUT, a gate that is connected to power supply line 34 (e.g., a positive power supply line that is driven to Vcc'), and a source terminal that is connected to internal node Z2. If desired, power supply line 34 may be driven to Vcch. Transistor N1 may have a drain terminal that is connected to internal node Z2, a gate that is connected to internal node Z1, and a source terminal that is connected to power supply line 32 (e.g., a ground power supply line that is driven to Vssl).

Similarly, transistors P2, N2, and N2' of INV2 may be coupled between power supply lines 30 and 32. Transistor P2 may have a source terminal that is connected to power supply line 30, a gate that is connected to data storage node OUT, and a drain terminal that is connected to data storage node OUT'. Transistor N2' may have a drain terminal that is connected to data storage node OUT', a gate that is connected to power supply line 34, and a source terminal that is connected to internal node Z1. Transistor N2 may have a drain terminal that is connected to internal node Z1, a gate that is connected to internal node Z2, and a source terminal that is connected to power supply line 32.

Memory cells such as memory cell 18 of FIG. 5 arranged in this way may sometimes be referred to as a decoupled latch memory cell, because the gates of additional transistors N1' and N2' are connected to separate positive power supply line 34 (e.g., transistors N1' and N2' have gates that are not connected to and are therefore "decoupled" from the storage/internal nodes of cell 18).

The inclusion of additional stacked transistor N1' in INV1 and transistor N2' in INV2 prevents the n-channel transistors in the storage portion of cell 18 (i.e., transistors N1 and N2) from being overstressed.

For example, consider a scenario in which cell 18 is storing a "1" (e.g., data storage node OUT is storing a "1" while data storage node OUT' is storing a "0") and is powered with voltage Vcch at 1.2 V, Vcc' at 1.0 V, and Vssl at −0.1 V. If data storage node OUT' is low, transistor P1 is turned on to pull data storage node OUT up to 1.2 V. As a result, internal node Z2 may be pulled up to one threshold voltage level Vt below Vcc' through transistor N1'. If threshold voltage level Vt of transistor N1' is equal to 0.3 V, internal node Z2 may, for example, be pulled up to 0.7 V (1.0 minus 0.3). Pulling up internal node Z2 turns on transistor N2 and pulls internal node Z1 down to −0.1 V, thereby turning off transistor N1 to prevent static current from flowing through circuit INV1. Transistor N2' may therefore pull data storage node OUT' down to −0.1 V. Transistor P2 is turned off so that no static current can flow through circuit INV2, because data storage node OUT is high.

An elevated control signal may be provided to gate 26 of transistor 24 using this approach (e.g., data storage node OUT may be driven to elevated positive power supply voltage Vcch through transistor P1). In this example, transistor N2' experiences gate-to-source voltage Vgs of 1.1 V (1.0 minus −0.1), whereas transistor N2 experiences Vgs of 0.8 V (0.7 minus −0.1). Vgs levels of 0.8 V and 1.1 V are acceptable transistor biasing levels that do not result in voltage overstress (e.g., these levels do not cause potential oxide breakdown), because these levels are less than an oxide breakdown voltage of 1.3 V (as an example).

In this example, transistor P1 may experience source-to-gate voltage Vsg of 1.3 V (1.2 minus −0.1). A Vsg of 1.3 V may be acceptable for p-channel transistors, because the oxide breakdown voltage for p-channel transistors is typically 100 to 200 mV higher than that of n-channel transistors.

Cell 18 may be configured to store a "0" (e.g., so that data storage node OUT is storing a "0" while data storage node OUT' is storing a "1") to provide a lowered control signal to gate 26 of pass gate 24. If data storage node OUT is low, transistor P2 is turned on to pull data storage node OUT' up to 1.2 V. As a result, internal node Z1 may be pulled up to 0.7 V through transistor N2' (assuming threshold voltage level Vt is equal to 0.3 V). Pulling up internal node Z1 turns on transistor N1 and pulls internal node Z2 down to −0.1 V, thereby turning off transistor N2 to prevent static current from flowing through circuit INV2. Transistor N1' may therefore drive data storage node OUT to −0.1 V, as desired. Transistor P1 is turned off so that no static current can flow through inverter INV1, because data storage node OUT' is high.

In this example, transistor N1' experiences a Vgs of 1.1 V (1.0 minus −0.1), whereas transistor N1 experiences a Vgs of 0.8 V (0.7 minus −0.1). These Vgs levels may satisfy design criteria and may allow cell 18 to function properly and reliably during operation of device 10.

As shown in FIG. 5, each n-channel transistor in the storage portion of memory cell 18 may have a body terminal that is connected to line 36. Line 36 may be driven to body biasing voltage Vb (e.g., line 36 is controlled by a biasing signal). Placing the n-channel transistors (i.e., transistors N1, N1', N2, and N2') in reverse body bias may in general reduce the leakage currents flowing through these transistors (e.g., by driving body biasing voltage Vb to −0.2 V, −0.3 V, etc.). Transistors P1 and P2 may have body terminals that are connected to their source terminals (e.g., the body terminals of transistors P1 and P2 may be connected to power supply line 30).

Leakage current contributions may include drain-to-source leakage currents and bulk leakage currents (e.g., leakage currents that flow from the gate to the body terminal). It is desirable to minimize leakage currents to reduce power consumption in device 10. At advanced technology nodes (e.g., sub 45 nm complementary metal-oxide-semiconductor processes), bulk leakage currents may increase exponentially with the amount of reverse bias applied. Gate induced drain leakage (GIDL) and band-to-band tunneling (BTBT) may contribute to bulk leakage (as examples).

The amount of bulk leakage currents may be a function of the amount of drain-to-gate voltage Vdg applied across a transistor. The inclusion of transistors N1' and N2' reduces the Vdg experienced by transistors N1 and N2 by limiting the drain voltage of transistors N1 and N2 to one threshold voltage level below Vcc'.

For example, consider a scenario in which transistor N1 is turned off (e.g., the gate of transistor N1 is driven to −0.1 V) and internal node Z2 is driven to a reduced voltage level of 0.7 V. Transistor N1 may therefore experience a Vdg of 0.8 V. If transistor N1' were not present, internal node Z2 would be driven to 1.2 V by transistor P1, and transistor N1 would experience a Vdg of 1.3 V (1.2 minus −0.1). A Vdg of 0.8 V may provide reduced bulk leakage currents in comparison to a Vdg of 1.3 V for an n-channel transistor in reverse body bias.

Access transistors such as access transistors TA1 and TA2 may be connected to the storage portion of memory cell 18 to perform read and write operations. As shown in FIG. 5, access transistor TA1 may be connected between a first data line (e.g., a true data line on which true data signal DL is conveyed) and internal node Z1, whereas access transistor TA2 may be connected between a second data line (e.g., a complementary data line on which complement data signal DLB is conveyed) and internal node Z2. Transistors TA1 and TA2 may each have a gate that is connected to an address line on which address signal ADD is conveyed.

During normal operation, the true and complementary data lines may be nominally driven to zero volts to minimize leakage currents, whereas address signal ADD may be deasserted (e.g., address signal ADD may be pulled low to disable access transistors TA1 and TA2). For example, address signal ADD may be driven to −0.1 V to reduce leakage currents through access transistors TA1 and TA2. If desired, address signal ADD may be driven to −0.2 V or other negative voltages to further reduce leakage through the access transistors.

Figure 6:
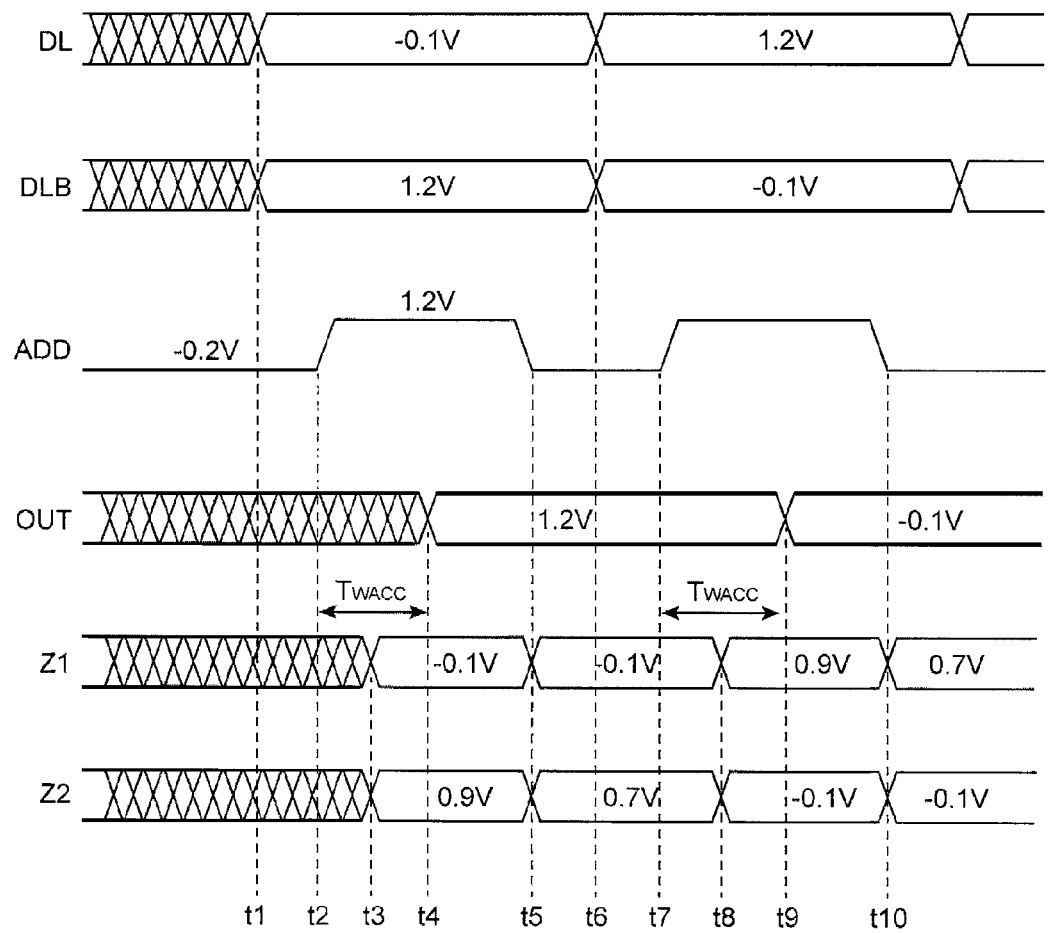
FIG. 6 is a timing diagram illustrating write operations for the memory element of FIG. 5 in accordance with an embodiment of the present invention.

FIG. 6 shows a timing diagram that illustrates the process of writing into a desired memory cell (e.g., cell 18). At time t1, desired data may be presented on the corresponding data lines (e.g., DL may be taken to −0.1 V and DLB may be taken to 1.2 V for writing a "1"). At this time, all address signals ADD may be deasserted (e.g., all address signals ADD may be driven to −0.2 V), and cell 18 may be storing an unknown value (see, e.g., node OUT in FIG. 6).

At time t2, address signal ADD corresponding to the desired cell may be asserted to turn on access transistors TA1 and TA2 in the desired cell. For example, a single address line along a row corresponding to the desired cell may be driven to 1.2 V to enable transistors TA1 and TA2 to write in a "1." Transistors such as transistors TA1 and TA2 that are enabled in this way tend not to experience reliability issues, because the gates of transistors TA1 and TA2 are only momentarily placed under such voltage stress during read/write operations (e.g., transistors TA1 and TA2 are not statically biased under voltage overstress conditions). If desired, address signal ADD may be driven to 1.1 V to reduce the amount of temporary voltage overstress experienced by access transistors TA1 and TA2 during read/write operations.

At time t3, access transistor TA1 may pull internal node Z1 down to −0.1 V, because data signal DL is at −0.1 V and n-channel transistor TA1 is capable of pulling down to −0.1 V. At the same time, access transistor TA2 may pull internal node Z2 up to 0.9 V (1.2 minus 0.3), because data signal DLB is at 1.2 V and n-channel transistor TA2 is capable of pulling up to one threshold voltage level (assumed to be 0.3 V in this example) below the asserted address signal level (1.2 V).

At time t4, node OUT may successfully be overwritten to store the desired value of "1" (e.g., node OUT is driven to 1.2 V through transistor P1). The time it takes to write into cell 18 after asserting address signal ADD (from time t2 to t4) may be referred to as write-access time $T_{WACC}$.

At time t5, address signal ADD may be deasserted. At this time, internal node Z1 may be held at −0.1 V through transistor N2, whereas internal node Z2 may be driven to 0.7 V by transistor N1' (e.g., internal nodes Z1 and Z2 are no longer driven to the data line voltage levels after the access transistors are disabled).

At time t6, signals DL and DLB may change to new values to write a "0" into the desired memory cell. For example, signal DL is at zero volts and DLB is at 1.2 V. At this time, all address signals ADD may be deasserted, and cell 18 may be storing a "1" that was previously written.

At time t7, address signal ADD corresponding to the desired cell may be asserted (e.g., signal ADD is pulled up to 1.2 V) to turn on access transistors TA1 and TA2. If desired, address signal ADD may be driven to 1.1 V to reduce the amount of temporary voltage overstress experienced by access transistors TA1 and TA2 during read/write operations.

At time t8, access transistor TA2 may pull internal node Z2 down to −0.1 V, because data signal DLB is at −0.1 V and n-channel transistor TA2 is capable of pulling down to −0.1 V. Meanwhile, access transistor TA1 may pull internal node Z1 up to 0.9 V (1.2 minus 0.3), because data signal DL is at 1.2 V and n-channel transistor TA1 is capable of pulling up to one threshold voltage level (assumed to be 0.3 V in this example) below the asserted address signal level (1.2 V).

At time t9, node OUT may successfully be overwritten to store the desired value of "0" (e.g., node OUT is driven to −0.1 V through transistors N1' and N1). The time it takes to write into cell 18 after asserting address signal ADD (from time t7 to t9) may also be referred to as write-access time $T_{WACC}$.

At time t10, address signal ADD may be deasserted. At this time, internal node Z2 may be held at −0.1 V by transistor N1, whereas internal node Z1 may be driven to 0.7 V by on transistor N2' (e.g., internal nodes Z1 and Z2 are no longer driven to the data line voltage levels after the access transistors are disabled).

The timing diagram of FIG. 6 is merely illustrative. Any desired data value may be written into any memory cell 18 in memory array 17 of FIG. 2 using a similar timing scheme as shown in FIG. 6.

Figure 7:
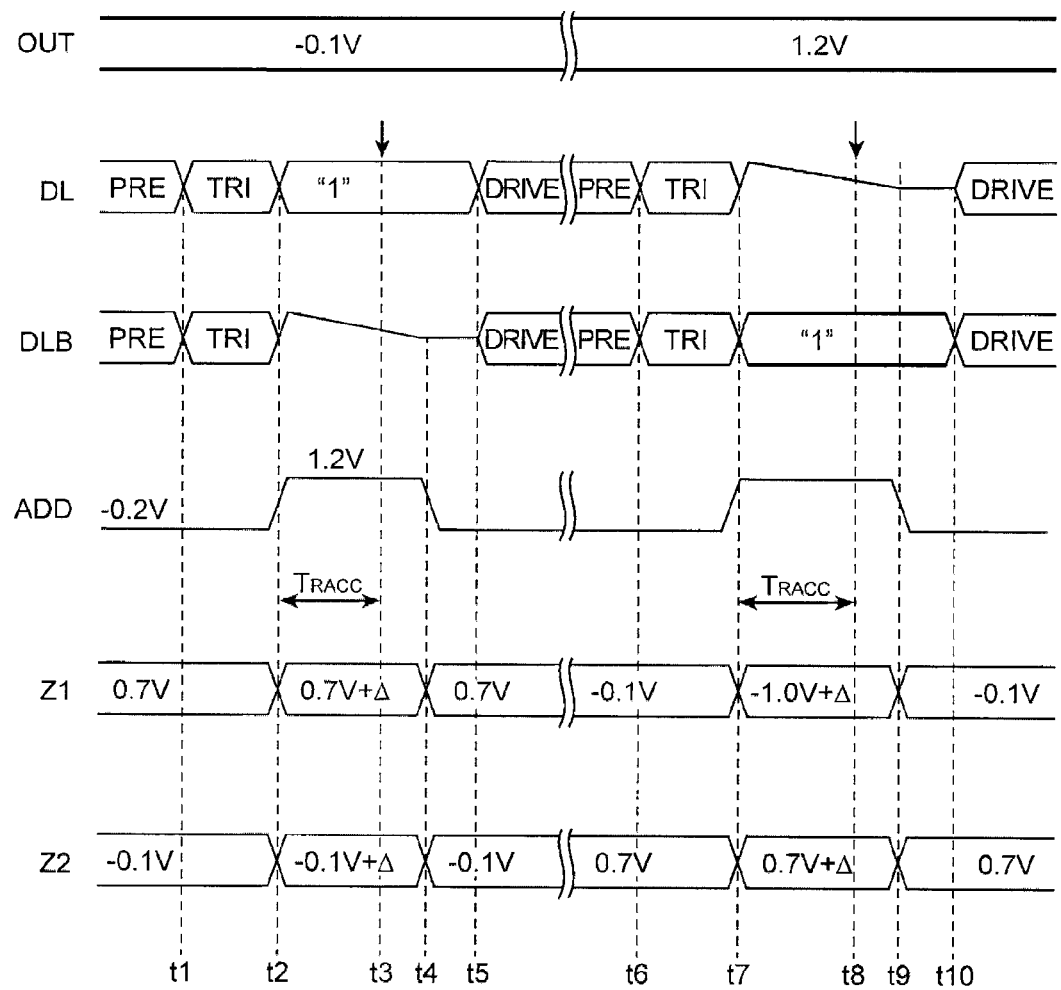
FIG. 7 is a timing diagram illustrating read operations for the memory element of FIG. 5 in accordance with an embodiment of the present invention.

FIG. 7 shows a timing diagram that illustrates the process of reading data out of a desired memory cell. Consider a scenario in which desired memory cell 18 is storing a "0" (e.g., node OUT is at −0.1 V). Cell 18 storing a "0" may, for example, have internal node Z1 at 0.7 V and internal node Z2 at −0.1 V. Device 10 may include precharge circuitry that precharges the data lines to 1.2 V prior to time t1 (as an example). If desired, the data lines may be precharged to 1.0 V, 0.6 V, zero volts, or any desired voltage level.

At time t1, the precharge circuitry may be disabled and the data lines may be placed in a tri-state mode in which the precharge voltage level (e.g., 1.2 V) is held by data line capacitance. The data lines are not actively driven by any power supply line during the tri-state mode. The address signals ADD may be deasserted at this time (e.g., all address signals ADD are at −0.2 V to minimize leakage through the access transistors).

At time t2, address signal ADD corresponding to the desired cell may be asserted. Asserting address signal ADD may cause data signal DLB to discharge towards ground through access transistor TA2, because internal node Z2 is at a low voltage. Data signal DL may remain at logic "1," because internal node Z1 is at a medium-high voltage level (e.g., internal node Z1 may be at 0.7 V). An internal voltage of 0.7 V may not be low enough to discharge the precharge voltage level held by the data line capacitance during read operations. During this time (e.g., when address signal ADD is asserted), charge sharing between the true complementary data line and internal node Z1 may cause a temporary voltage rise at internal node Z1 (e.g., internal node Z1 is at 0.7 V+Δ), as shown in FIG. 7. Similarly, charge sharing between the complementary data line and internal node Z2 may cause a temporary voltage rise at internal node Z2 (e.g., internal node Z2 is at −0.1 V+Δ).

At time t3, a sufficient data line voltage differential (e.g., a voltage difference between data signals DL and DLB) may be obtained. A read value corresponding to the value of data storage node OUT may be sampled. For example, device 10 may include sense amplifier circuitry that is used to detect read data depending on the polarity of the data line voltage differential. In this example, a positive data line voltage differential (e.g., data signal DLB may be 200 mV lower than data signal DL) may indicate a read value of "0." The amount of time from asserting address signal ADD to properly sampling the read data from the data lines (e.g., from time t2 to t3) may be referred to as read-access time $T_{RACC}$. At time t4, address signal ADD may be deasserted.

After deassertion of address signal ADD, data signal DLB may remain constant, because access transistors TA1 and TA2 are turned off to prevent further discharging at the data lines. At time t4, internal node Z1 may return to its normal operating voltage of 0.7 V, whereas internal node Z2 may return to its normal operating voltage of −0.1 V (e.g., turning off the access transistors prevents charge sharing between the data lines and internal nodes Z1 and Z2). At time t5, data circuitry may drive the read data onto control circuitry 12 (FIG. 2) for further processing.

A logic "1" stored at node OUT may be read in a similar fashion, as shown in FIG. 7. Cell 18 storing a "1" may, for example, have internal node Z1 at −0.1 V and internal node Z2 at 0.7 V. The precharge circuitry may precharge the data lines to 1.2 V prior to time t6 (as an example).

At time t6, the precharge circuitry may be disabled and the data lines may be placed in the tri-state mode. The address signals ADD may be deasserted at this time.

At time t7, address signal ADD corresponding to the desired cell may be asserted. Asserting address signal ADD may cause data signal DL to discharge towards ground through access transistor TA1, because internal node Z1 is at a low voltage. Data signal DLB may remain at logic "1", because internal node Z2 is at 0.7 V (as an example). An internal voltage of 0.7 V may not be low enough to discharge the precharge voltage level held by the data line capacitance. During this time, charge sharing between the true complementary data line and internal node Z1 may cause a temporary voltage rise at internal node Z1 (e.g., internal node Z1 is at −0.1 V+Δ). Similarly, charge sharing between the complementary data line and internal node Z2 may cause a temporary voltage rise at internal node Z2 (e.g., internal node Z2 is at 0.7 V+Δ).

At time t8, a sufficient data line voltage differential may be obtained. A read value corresponding to the value of data storage node OUT may be sampled. For example, the sense amplifier circuitry may be used to detect read data depending on the polarity of the data line voltage differential. In this example, a negative data line voltage differential (e.g., data signal DL may be 300 mV lower than data signal DLB) may indicate a read value of "1." The amount of time from asserting address signal ADD to properly sampling the read data from the data lines (e.g., from time t7 to t8) may be referred to as read-access time $T_{RACC}$.

At time t9, address signal ADD may be deasserted. After deassertion of address signal ADD, data signal DL may remain constant, because access transistors TA1 and TA2 are turned off to prevent further discharging at the data lines. At time t9, internal node Z1 may return to its normal operating voltage of −0.1 V, whereas internal node Z2 may return to its normal operating voltage of 0.7 V (e.g., turning off the access transistors prevents charge sharing between the data lines and internal nodes Z1 and Z2). At time t10, the data circuitry may drive the read data onto control circuitry 12 (FIG. 2) for further processing.

The timing diagram of FIG. 7 is merely illustrative. Any desired data value may be read out from memory cell 18 using a similar timing scheme as shown in FIG. 7.

Figure 8:
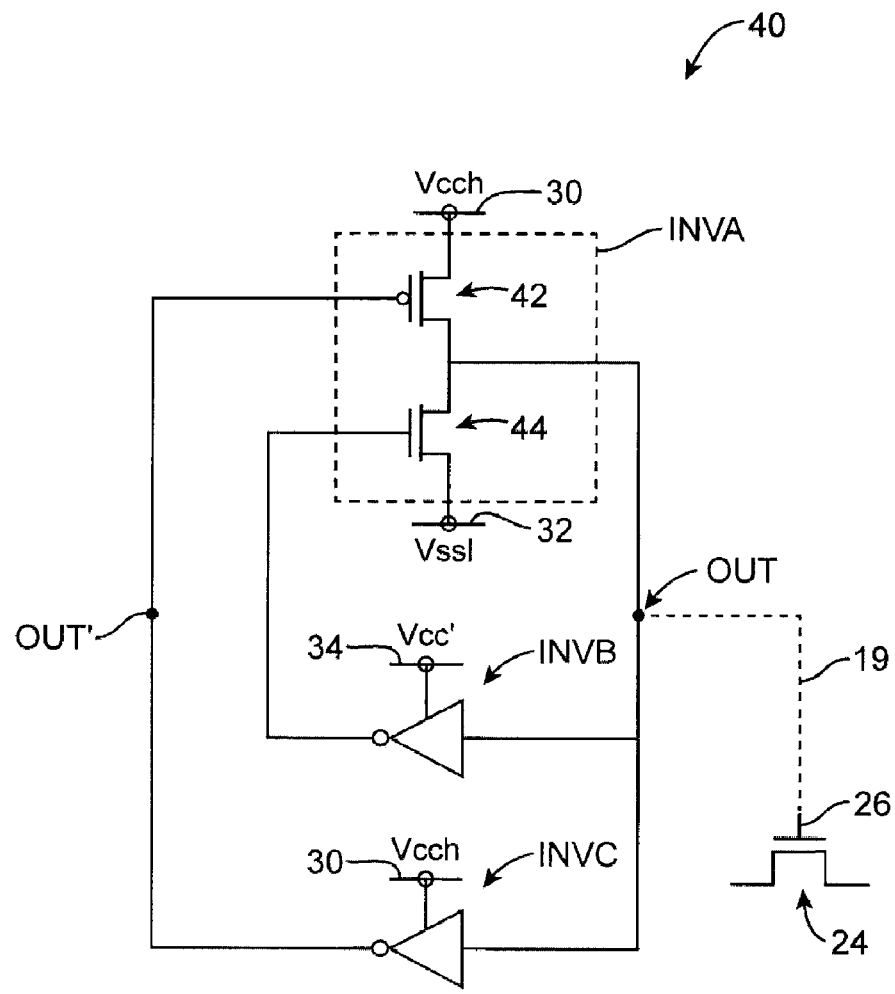
FIG. 8 is a diagram of an illustrative memory element with voltage overstress protection in accordance with an embodiment of the present invention.

FIG. 8 shows another suitable arrangement that may be used for the storage portion of a memory cell in array 17. FIG. 8 shows a simplified diagram for storage portion 40. Storage portion 40 may be used to provide voltage overstress protection by including an inverter-like circuit that is supplied with a separate voltage level (e.g., voltage Vcc') that is lower than elevated positive power supply voltage level Vcch.

Storage portion 40 may include an inverter-like circuit INVA that is cross-coupled with inverter-like circuit INVB and inverter INVC (see, e.g., FIG. 8). Inverter-like circuit INVA may include p-channel transistor 42 and n-channel transistor 44 connected in series between power supply line 30 (e.g., a positive power supply line that is driven to Vcch) and power supply line 32 (e.g., a ground power supply line that is driven to Vssl). The drain terminals of transistors 42 and 44 are connected to form an output for circuit INVA. The output of circuit INVA may be connected to data storage node OUT in storage portion 40.

Inverter-like circuit INVB may be supplied by power supply line 34 (e.g., a positive power supply line that is driven to Vcc'). Circuit INVB may have an input that is connected to data storage node OUT and an output that is connected to a gate of transistor 44.

Inverter INVC may be supplied by power supply line 30. Inverter INVC may have an input that is connected to data storage node OUT and an output that is connected to a gate of transistor 42. The output of inverter INVC may be connected to data storage node OUT'. Data storage node OUT' may store an inverted version of the value stored at data storage node OUT. For example, storage portion 40 may be configured to store a logic "1" (e.g., data storage node OUT is driven to Vcch through transistor 42). Data storage node OUT' may therefore be driven to a low voltage level.

Consider a scenario in which storage portion 40 is storing a logic "0" and is powered by Vcch at 1.2 V, Vssl at −0.1 V, and Vcc' at 1.0 V. Data storage node OUT may be driven to −0.1 V through transistor 44. Circuit INVB may drive the input of transistor 44 to 1.0 V, because the input of circuit INVB (i.e., node OUT) is low. N-channel transistor 44 may therefore experience a gate-to-source voltage Vgs of 1.1 V (1.0 minus −0.1). A Vgs level of 1.1 V may be acceptable and may not cause any device reliability issues. The amount of voltage stress can be controlled by changing the value of Vcc'. If desired, Vcc' may be lowered below 1.0 V to further reduce the voltage stress experienced by circuit INVB.

Consider another scenario in which storage portion 40 is storing a logic "1." Data storage node OUT may be driven to 1.2 V through transistor 42. Inverter INVC may drive the input of transistor 42 to a low voltage, because the input of circuit INVC (i.e., node OUT) is high.

Storage portion 40 may therefore be used to provide a static control signal at data storage node OUT to gate 26 of pass gate 24 over line 19 (e.g., storage portion 40 may be used to provide elevated positive power supply voltage Vcch at OUT to turn on transistor 24 for increased performance or to provide lowered power supply voltage Vssl at OUT to turn off transistor 24 for reduced leakage).

Figure 9:
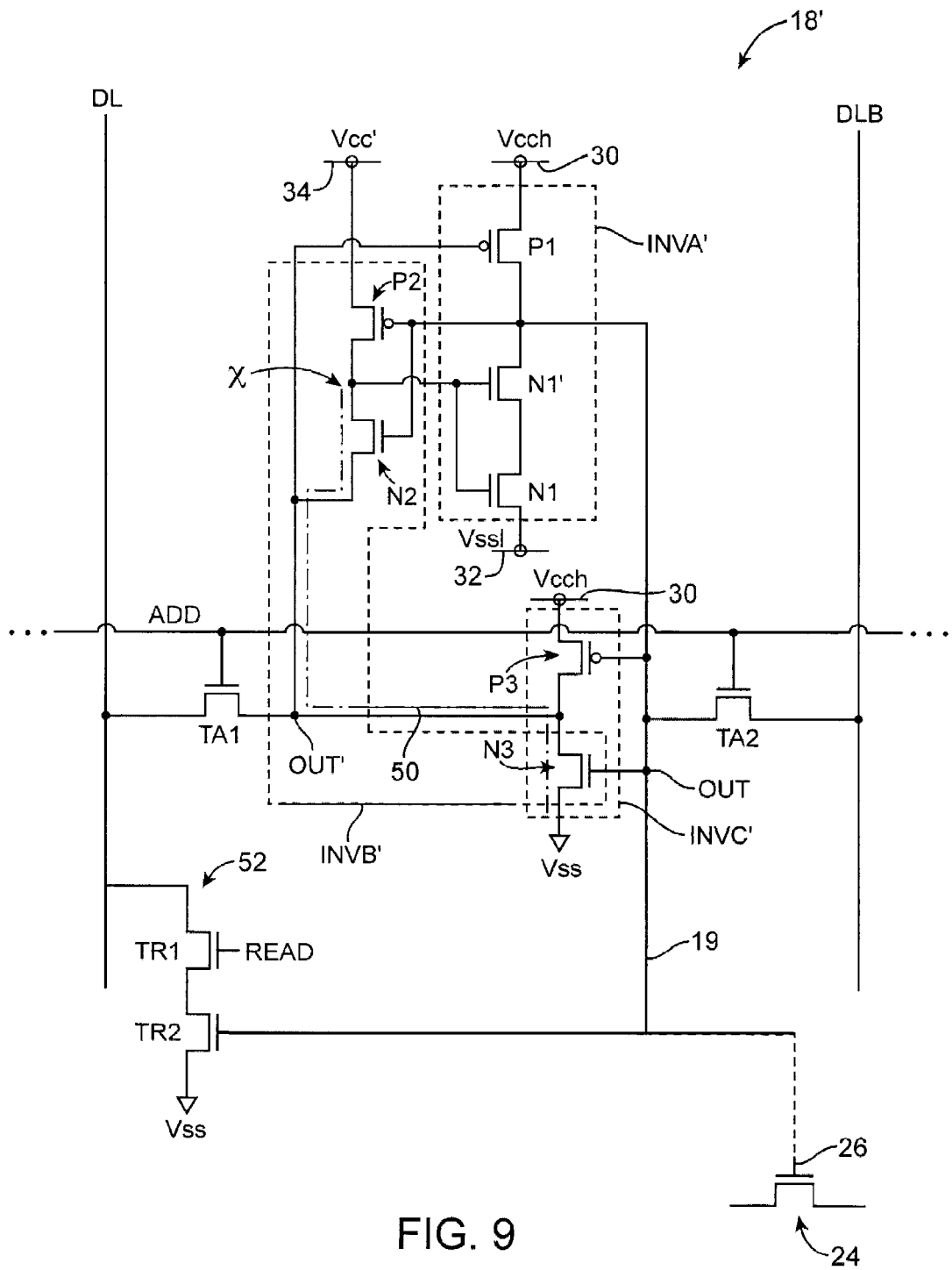
FIG. 9 is a circuit diagram of the memory element of FIG. 8 in accordance with an embodiment of the present invention.

FIG. 9 is a circuit diagram of a memory cell that includes a storage portion of the type described in connection with FIG. 8. As shown in FIG. 9, memory cell 18' may include inverter-like circuit INVA' cross-coupled to inverter-like circuit INVB' and inverter INVC'. The storage portion of cell 18' may have data storage nodes OUT and OUT' respectively driven by an output of circuit INVA' and by an output of inverter INVC'.

Inverter-like circuit INVA' may include p-channel transistor P1 and n-channel transistors N1' and N1 connected in series. Transistor P1 may be coupled between power supply line 30 (e.g., a power supply line that is driven to elevated positive power supply voltage Vcch) and data storage node OUT (e.g., the output of INVA'). Transistors N1' and N1 may be coupled between data storage node OUT and power supply line 32 (e.g., a power supply line that is driven to lowered ground power supply voltage Vssl). Transistor P1 may have a gate that serves as a first input to circuit INVA'. Transistor N1' may have a gate that is connected to a gate of transistor N1 and that serves as a second input to circuit INVA'.

Inverter-like circuit INVB' may include p-channel transistor P2 and n-channel transistors N2 and N3 connected in series. Transistor P2 may be coupled between power supply line 34 (e.g., a power supply line that is driven to voltage Vcc') and intermediate node X. Transistor N2 may be coupled between intermediate node X and data storage node OUT', whereas transistor N3 may be coupled between data storage node OUT' and a ground line (e.g., a ground power supply line that is driven to zero volts (Vss)). Transistors P2 and N2 may each have a gate. The gate of transistor P2 may be connected to the gate of transistor N2. Transistor N3 may have a gate that is connected to data storage node OUT. The gate of transistor P2 (and transistor N2) may serve as an input to circuit INVB', whereas intermediate node X may serve as an output to circuit INVB'. The input of INVB' may be connected to the output of circuit INVA' (e.g., the gate of transistor P2 is connected to data storage node OUT), while the output of INVB' may be connected to the second input of circuit INVA' (e.g., intermediate node X is connected to the gate of transistor N1').

Inverter INVC' may include p-channel transistor P3 and n-channel transistor N3 connected in series. Transistor N3 may be shared between INVB' and INVC' (e.g., circuits INVB' and INVC' share a common pull-down path to the ground line). Transistor P3 may be coupled between power supply line 30 and data storage node OUT', while transistor N3 may be coupled between node OUT' and the ground line. Transistors P3 may have a gate. The gate of transistor P3 may be connected to the gate of transistor N3. The gate of transistor P3 (and transistor N3) may serve as an input to inverter INVC'. Inverter INVC' may have an output that drives data storage node OUT' (e.g., the output of inverter INVC' is connected to the first input of INVA').

Arranged in this way, the storage portion of cell 18' may provide voltage overstress protection. For example, consider a scenario in which cell 18' is storing a logic "0" (e.g., data storage node OUT is storing a low voltage) and voltage Vcch is at 1.2 V, Vssl is at −0.1 V, Vcc' is at 1.0 V, and Vss is at zero volts. A low voltage at node OUT will cause inverter INVC' to drive node OUT' to 1.2 V (as an example). The low voltage at node OUT will also turn on p-channel transistor P2 to pull intermediate node X all the way up to Vcc' (e.g., 1.0 V). Pulling up the second input of circuit INVA' enables transistors N1' and N1 to pull data storage node OUT all the way down to −0.1 V.

In this example, transistors N1' and N1 experience a gate-to-source voltage Vgs of 1.1 V (1.0 minus −0.1), whereas transistor N3 experiences a Vgs of 1.2 V (1.2 minus 0). Vgs values of 1.1 and 1.2 may be acceptable and may not result in undesirable oxide breakdown (e.g., assuming device breakdown voltage is equal to 1.3 V). The amount of voltage stress can be controlled by changing the value of Vcc'. If desired, Vcc' may be lowered below 1.0 V to further reduce voltage stress experienced by circuits INVA' and INVC'.

In this example, transistor P3 experiences a source-to-gate voltage Vsg of 1.3 V (1.2 minus −0.1). A Vsg level of 1.3 V may be acceptable for p-channel transistors, because p-channel transistors can typically tolerate higher voltage overstress than n-channel transistors.

Stacking transistors N1' and N1 (e.g., connecting transistors of the same channel type in series) may reduce leakage currents through circuit INVA'. Similarly, connecting a source terminal of transistor N2 to a drain terminal of transistor N3 creates a stacked pull-down current path (as indicated by path 50) that reduces leakage currents through circuit INVB'.

If desired, the source of transistor N2 may be connected to the ground line (e.g., a ground power supply line driven to zero volts). The p-channel transistors (i.e., transistors P1, P2, and P3) may each have a body terminal that is connected to their respective source terminals. If desired, the n-channel transistors in the storage portion of cell 18' (i.e., transistors N1, N1', N2, and N3) may each have a body terminal that is controlled by body biasing voltage Vb. Body biasing voltage Vb may, for example, have a voltage value of −0.2 V or −0.3 V to reverse bias each of the n-channel transistors to further reduce leakage currents.

A static control signal may be provided at data storage node OUT to gate 26 of pass gate 24 over line 19. For example, data storage node OUT may be pulled up to elevated positive power supply voltage Vcch through transistor P1 to turn on pass gate 24, whereas data storage node OUT may be pulled down to lowered ground power supply voltage Vssl through transistors N1' and N1 to turn off pass gate 24 (see, e.g., FIG. 9).

Access transistors may be connected to the storage portion of cell 18'. As shown in FIG. 9, access transistor TA1 may be connected between data storage node OUT' and a first data line (e.g., a true data line on which true data signal DL is conveyed), whereas access transistor TA2 may be connected between data storage node OUT and a second data line (e.g., a complement data line on which complementary data signal DLB is conveyed). Access transistors TA1 and TA2 (sometimes referred to as address transistors) may each have a gate that is controlled by address signal ADD. Address signal ADD may remain deasserted during normal operation and during read operations and may be asserted during write operations to write desired data into cell 18'.

Cell 18' may have a read circuit such as read circuit 52 that is used for reading data from cell 18'. Read circuit 52 may sometimes be referred to as a read buffer circuit. Read circuit 52 may include n-channel read transistors TR1 and TR2 connected in series. Transistors TR1 and TR2 may be coupled between the first data line and the ground line. Transistor TR2 may have a gate that is connected to data storage node OUT, whereas transistor TR1 may have a gate that is controlled by read control signal READ.

During read operations, the first data line may be precharged to 1.2 V (as an example). Buffer circuit 52 may discharge the first data line towards zero volts when reading a "1" (e.g., data storage node OUT is storing a "1"). The first data line may remain high when reading a "0" (e.g., data storage node OUT is storing a "0"). Reading cell 18' in this way provides no read disturb (e.g., a negligible voltage rise at corresponding storage node OUT), because the node OUT is connected to the gate of transistor TR2 in read buffer circuit 52. Read buffer circuit 52 shown in FIG. 9 is merely illustrative. Other types of buffer circuits that provides zero read disturb may be used, if desired.

Figure 10:
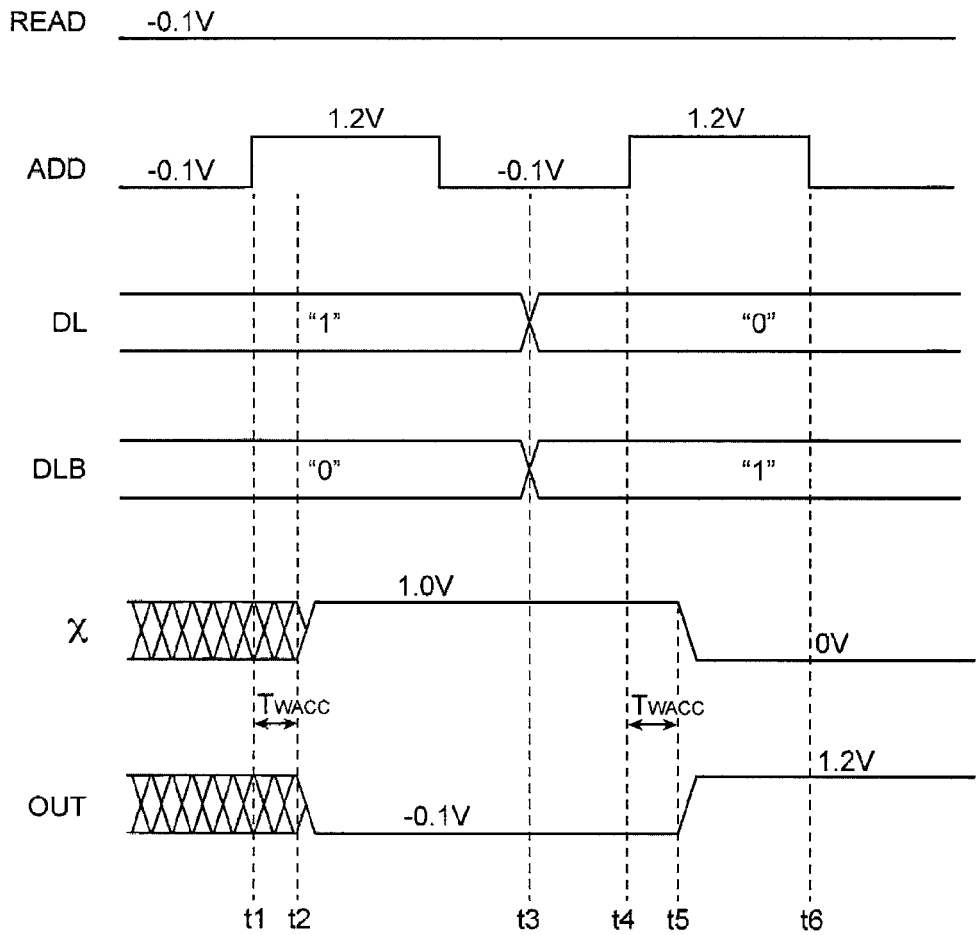
FIG. 10 is a timing diagram illustrating write operations for the memory element of FIG. 9 in accordance with an embodiment of the present invention.

FIG. 10 is a timing diagram that shows write operations associated with cell 18' of FIG. 9. Control signal READ may remain deasserted during write operations (e.g., signal READ is at –0.1 V). Prior to time t1, address signal ADD may be deasserted (e.g., address signal is at –0.1 V), a desired cell may be storing an unknown data value, data signals DL and DLB may be respectively driven to logic "1" and "0" to write a "0" into the desired cell.

At time t1, address signal ADD may be asserted (e.g., address signal is raised to 1.2 V) to enable access transistors TA1 and TA2. At time t2, intermediate node X may be driven to Vcc' (e.g., 1.0 V) through transistor P2, whereas data storage node OUT may be driven to Vssl (e.g., –0.1 V) through transistors N1' and N1. The amount of time from asserting address signal ADD to successfully write in a new value into the desired cell may be referred to as write-access time $T_{WACC}$ (e.g., from time t1 to t2), as shown in FIG. 10. Address signal ADD may be deasserted after the new value has been written (at time t3).

Data signals DL and DLB may be respectively driven to logic "0" and "1" to write a "1" into the desired cell. At time t4, address signal ADD may be asserted to begin another write cycle. At time t4, intermediate node X may be driven to Vss (e.g., zero volts) through transistors N2 and N3, whereas data storage node OUT may be driven to Vcch (e.g., 1.2 V) through transistor P1. Address signal ADD may be deasserted after the new value has been written (at time t6).

The timing diagram of FIG. 10 is merely illustrative. Any desired data value may be written into any memory cell 18' in memory array 17 of FIG. 2 using a similar timing scheme as shown in FIG. 10.

Figure 11:
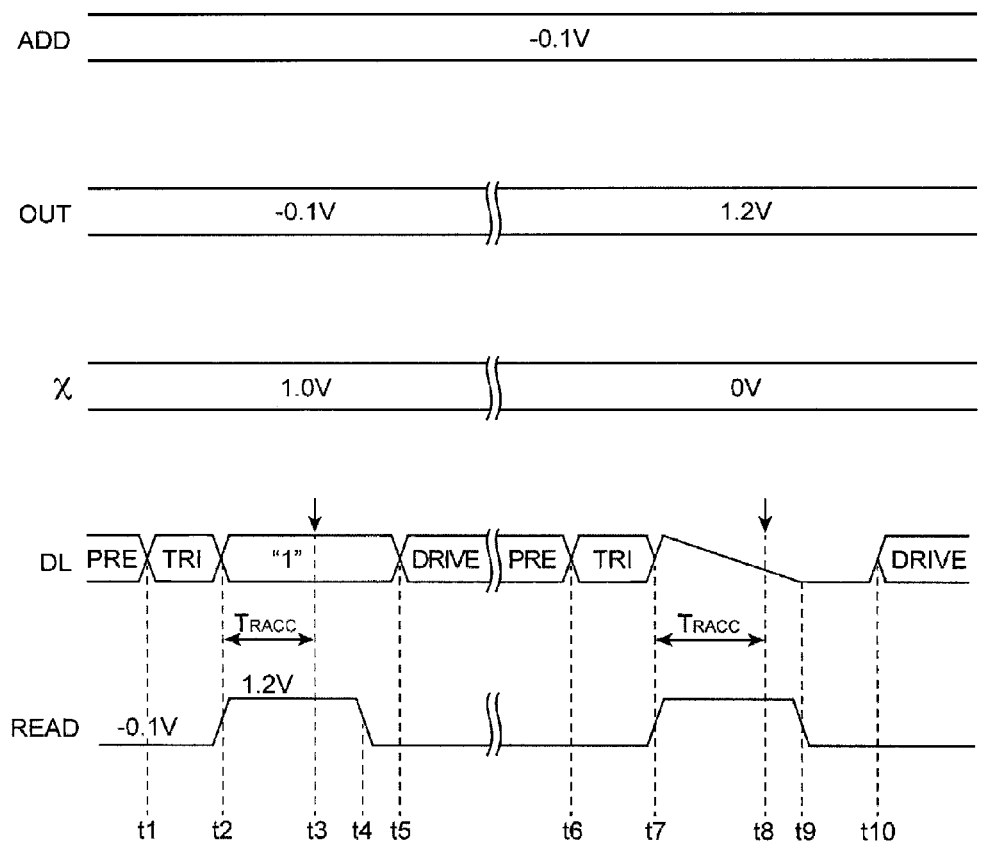
FIG. 11 is a timing diagram illustrating read operations for the memory element of FIG. 9 in accordance with an embodiment of the present invention.

FIG. 11 shows a timing diagram that illustrates the process of reading data out of a desired memory cell (e.g., cell 18'). Consider a scenario in which memory cell 18' is storing a "0" (e.g., node OUT is at –0.1 V). Cell 18 storing a "0" may, for example, have intermediate node X at 1.0 V. Address signal ADD may be deasserted during read operations of memory cell 18'. The precharge circuitry may precharge the data lines to 1.2 V prior to time t1 (as an example). If desired, the data line may be precharge to 1.0V, 0.5V, zero volts, or any desired voltage value.

At time t1, the precharge circuitry may be disabled and the first data line may be placed in a tri-state mode in which the precharge voltage level (e.g., 1.2 V) is held by the data line capacitance. The data lines are not actively driven by any power supply line during the tri-state mode. Control signals READ may be deasserted at this time (e.g., all control signals READ are at –0.1 V to minimize leakage through the read buffer transistors).

At time t2, control signal READ corresponding to the desired cell may be asserted. Data signal DL may remain at logic "1," because data storage node OUT is at a low voltage (e.g., buffer circuit 52 is disabled, because transistor TR2 is off).

At time t3, a read value corresponding to the value of data storage node OUT may be sampled by read circuitry. A sampled voltage that is high may correspond to a read value of "0" (as an example). The amount of time from asserting control signal READ to properly sampling the read data from the data lines (e.g., from time t2 to t3) may be referred to as read-access time $T_{RACC}$.

At time t4, address signal ADD may be deasserted. At time t5, the data circuitry may drive the read data onto control circuitry 12 (FIG. 2) for further processing.

A logic "1" stored at node OUT may be read out in a similar fashion, as shown in FIG. 11. Cell 18' storing a "1" may, for example, have data storage node OUT at 1.2 V and intermediate node X at zero volts. The precharge circuitry may precharge the data lines to 1.2 V prior to time t6 (as an example).

At time t6, the precharge circuitry may be disabled and the first data line may be placed in a tri-state mode in which the precharge voltage level (e.g., 1.2 V) is held by the data line capacitance.

At time t7, control signal READ corresponding to the desired cell may be asserted. Data signal DL may discharge towards ground through read buffer 52, because data storage node OUT is at a high voltage (e.g., read circuit 52 is enabled, because transistors TR1 and TR2 are turned on).

At time t8, a read value corresponding to the value of data storage node OUT may be sampled by the read circuitry. A sampled voltage that is low may correspond to a read value of "1" (as an example). The amount of time from asserting control signal READ to properly sampling the read data from the data lines (e.g., from time t7 to t8) may be referred to as read-access time $T_{RACC}$.

At time t9, address signal ADD may be deasserted. At time t10, the data circuitry may drive the read data onto control circuitry 12 (FIG. 2) for further processing.

The timing diagram of FIG. 11 is merely illustrative. Any desired data value may be read out from memory cell 18' using a similar timing scheme as shown in FIG. 11.

The foregoing is merely illustrative of the principles of this invention and various modifications can be made by those skilled in the art without departing from the scope and spirit of the invention.

What is claimed is:

1. A memory element, comprising:
   a first power supply line that receives a first power supply voltage;
   a second power supply line that receives a second power supply voltage that is different than the first power supply voltage; and
   first and second circuits that are interconnected to form a bistable element having a data storage node on which data is stored during a normal operating mode of the memory element, wherein the stored data has a first state or a second state during the normal operating mode, wherein the first circuit is powered by the first power supply voltage and includes a transistor with a gate, wherein the gate receives the second power supply voltage at least when the data has the first state, and wherein the second power supply line is connected to the gate of the transistor in the first circuit so that during the normal operating mode the gate of the transistor in the first circuit receives the second power supply voltage when the data has the first state and when the data has the second state.

2. The memory element defined in claim 1 wherein the transistor comprises an n-channel transistor.

3. The memory element defined in claim 1 wherein the second circuit includes a transistor with a gate that is connected to the second power supply line so that during the normal operating mode the gate of the transistor in the second circuit receives the second power supply voltage when the data has the first state and when the data has the second state.

4. The memory element defined in claim 3 further comprising a third power supply line that receives a third power supply voltage, wherein the first circuit is coupled between the first power supply line and the third power supply line and wherein the second circuit is coupled between the first power supply line and the third power supply line.

5. The memory element defined in claim 4 wherein the memory element forms part of an integrated circuit that is powered using a ground voltage and wherein the third power supply line is configured to receive a voltage that is lower than the ground voltage.

6. The memory element defined in claim 1 further comprising at least one access transistor coupled to the first circuit, wherein the at least one access transistor is turned off during the normal operating mode.

7. The memory element defined in claim 1 further comprising at least one access transistor coupled to the first circuit, wherein the at least one access transistor is turned off during the normal operating mode and wherein the second power supply voltage is less than the first power supply voltage.

8. A memory element, comprising:
a first power supply line that receives a first power supply voltage;
a second power supply line that receives a second power supply voltage that is different than the first power supply voltage;
first and second circuits that are interconnected to form a bistable element having a data storage node on which data is stored during a normal operating mode of the memory element, wherein the stored data has a first state or a second state during the normal operating mode, wherein the first circuit is powered by the first power supply voltage and includes a transistor with a gate, wherein the gate receives the second power supply voltage at least when the data has the first state, wherein the second power supply line is coupled to the second circuit, and wherein the second power supply voltage powers the second circuit; and
first and second ground lines that respectively receive different first and second ground power supply voltages, wherein the first circuit is coupled between the first power supply line and the first ground line, and wherein the second circuit is coupled between the second power supply line and the second ground line.

9. The memory element defined in claim 8 wherein the second circuit comprises a transistor that is turned on when the stored data has the first state so that the second power supply voltage passes to the gate of the transistor in the first circuit through the transistor in the second circuit.

10. The memory element defined in claim 9 wherein the transistor in the second circuit comprises a p-channel transistor having a gate connected to the data storage node.

11. The memory element defined in claim 8 further comprising a third circuit coupled between the first power supply line and the second ground line.

12. The memory element defined in claim 11 further comprising a shared transistor that forms part of the second circuit and that forms part of the third circuit.

13. A memory element comprising:
first and second circuits that are interconnected to form a bistable element having first and second data storage nodes, wherein each data storage node is coupled between first and second transistors in a respective one of the first and second circuits and wherein the first and second transistors in each of the first and second circuits are coupled between a positive power supply line on which a positive power supply voltage is provided and a ground power supply line; and
an additional transistor connected in series with the first and second transistors in each of the first and second circuits, wherein the additional transistor in each of the first and second circuits has a gate that is connected to an additional positive power supply line on which a static power supply voltage that is different than the positive power supply voltage is provided.

14. The memory element defined in claim 13, wherein the additional transistor in the first circuit comprises an n-channel transistor and wherein the additional transistor in the second circuit comprises an n-channel transistor.

15. The memory element defined in claim 13, wherein the positive power supply line is configured to receive a first positive power supply voltage, wherein the additional positive power supply line is configured to receive a second positive power supply voltage, and wherein the second positive power supply voltage is less than the first positive power supply voltage.

16. The memory element defined in claim 13, wherein the memory element forms part of an integrated circuit that is powered using a first ground power supply voltage and wherein the ground power supply line is driven to a second ground power supply voltage that is less than the first ground power supply voltage.

17. The memory element defined in claim 13, further comprising access transistors that are turned on to read data from the memory element during read operations and that write data into the memory element during write operations.

18. The memory element defined in claim 13, wherein the first circuit has an output that is connected to the first data storage node and wherein the memory element provides a static control signal to a gate of a programmable pass transistor at the output.

19. A memory element, comprising:
first, second, and third circuits that are interconnected to form a bistable element having first and second data storage nodes that store data during a normal operating mode, wherein:
the first circuit is coupled between a first positive power supply line and a first ground power supply line;
the third circuit is coupled between the first positive power supply line and a second ground power supply line; and
the second circuit is coupled between a second positive power supply line and the second ground power supply line, wherein the first and second positive power supply lines carry different voltages and wherein the first and second ground power supply lines carry different voltages.

20. The memory element defined in claim 19, wherein the first positive power supply line is configured to receive a first positive power supply voltage, wherein the second positive power supply line is configured to receive a second positive power supply voltage, and wherein the second positive power supply voltage is less than the first positive power supply voltage.

21. The memory element defined in claim 20, wherein the first ground power supply line is configured to receive a first ground power supply voltage, wherein the second ground power supply line is configured to receive second ground power supply voltage, and wherein the first ground power supply voltage is less than the second ground power supply voltage.

22. The memory element defined in claim 21, further comprising access transistors that write data into the memory element during write operations and a read buffer circuit that reads data from the memory element during read operations.

23. The memory element defined in claim 19, wherein the first circuit has an output that is connected to the first data storage node and wherein the memory element provides a static control signal to a gate of a programmable pass transistor at the output.

24. The memory element defined in claim 19, wherein the first circuit includes at least two n-channel transistors that are connected in series.

* * * * *